(12) United States Patent
Yener et al.

(10) Patent No.: US 7,959,695 B2
(45) Date of Patent: Jun. 14, 2011

(54) FIXED ABRASIVE ARTICLES UTILIZING COATED ABRASIVE PARTICLES

(75) Inventors: Doruk O. Yener, Grafton, MA (US); Alan J. Brandes, Rutland, MA (US); Ralph Bauer, Ontario (CA)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 375 days.

(21) Appl. No.: 12/053,426

(22) Filed: Mar. 21, 2008

(65) Prior Publication Data

US 2009/0235591 A1    Sep. 24, 2009

(51) Int. Cl.
*C23C 16/40* (2006.01)
*C09K 3/14* (2006.01)

(52) U.S. Cl. ............... 51/308; 51/295; 51/307; 51/309; 427/255.18; 427/255.19

(58) Field of Classification Search .............. 51/295, 51/307, 308, 309; 427/255.18, 255.19
See application file for complete search history.

(56) References Cited

U.S. PATENT DOCUMENTS

| | | | |
|---|---|---|---|
| 4,997,461 A | 3/1991 | Markhoff-Matheny et al. | |
| 5,011,508 A | 4/1991 | Wald et al. | |
| 5,104,422 A | 4/1992 | St. Pierre | |
| 5,131,923 A | 7/1992 | Markhoff-Matheny et al. | |
| 5,213,591 A | 5/1993 | Celikkaya et al. | |
| 5,547,479 A | 8/1996 | Conwell et al. | |
| 5,593,468 A | 1/1997 | Khaund et al. | |
| 5,611,829 A | 3/1997 | Monroe et al. | |
| 5,651,801 A | 7/1997 | Monroe et al. | |
| 5,674,122 A * | 10/1997 | Krech | 451/536 |
| 6,048,577 A | 4/2000 | Garg | |
| 6,258,141 B1 | 7/2001 | Sung et al. | |
| 6,454,819 B1 | 9/2002 | Yano et al. | |
| 6,773,475 B2 | 8/2004 | Ohishi | |
| 6,802,878 B1 | 10/2004 | Monroe | |
| 6,896,710 B2 | 5/2005 | Grunwald | |
| 6,918,820 B2 | 7/2005 | Smith et al. | |
| 2002/0003225 A1 | 1/2002 | Hampden-Smith et al. | |
| 2003/0168627 A1 | 9/2003 | Singh et al. | |
| 2005/0050802 A1 | 3/2005 | Wurzer et al. | |
| 2005/0129975 A1 | 6/2005 | Ihara | |

* cited by examiner

*Primary Examiner* — Elizabeth D Wood
(74) *Attorney, Agent, or Firm* — Abel Law Group, LLP (57) ABSTRACT

An fixed abrasive article is provided which includes a matrix material and abrasive particles embedded within the matrix material. The abrasive particles have a core-shell structure that includes a polycrystalline alpha alumina core and a shell layer overlying the polycrystalline alpha alumina core. The shell layer includes a material selected from the group consisting of silicon oxide and zirconium oxide. Also the polycrystalline alpha alumina core includes grains and having an average grain size of not greater than about 500 nm.

21 Claims, 9 Drawing Sheets

FIG. 10

FIXED ABRASIVE ARTICLES UTILIZING COATED ABRASIVE PARTICLES

CROSS-REFERENCE TO RELATED APPLICATION(S)

Background

1. Field of the Disclosure

The present invention is related to fixed abrasives, particularly fixed abrasives incorporating coated abrasive particles.

2. Description of the Related Art

Abrasives are generally utilized in the polishing and preparation of surfaces. The applications that utilize abrasives vary widely, including for example, utilization of free abrasives in slurries for polishing applications such as chemical mechanical polishing (CMP) in the semiconductor industry. Alternatively, abrasives can be utilized in fixed abrasive articles such as bonded and coated abrasives which can include devices such as grinding wheels, belts, rolls, disks and the like.

Fixed abrasives generally differ from free abrasives in that fixed abrasives utilize abrasive grains or grit within a matrix of material which fixes the position of the abrasive grains relative to each other. A common fixed abrasive grit typically is alumina. Alumina has been utilized for some time and is well known to be an effective abrasive as it is very hard and abundantly available. However, it has been recognized that alumina grains of a finer size, generally a submicron size, can improve grinding performance, particularly in applications desiring precise, smooth, polished surfaces. However, utilization of fine grained alumina, particularly in the context of fixed abrasives, has posed unique obstacles, including for example, forming/sourcing of fine grained alumina, formation and compatibility of fine grained alumina with other materials within the fixed abrasive, as well as mechanical and chemical stability of fixed abrasive devices utilizing such fine grains.

Prior attempts of improved alumina abrasive materials include approaches such as that disclosed in U.S. Pat. No. 6,258,141 and U.S. Pat. No. 5,131,923. The U.S. Pat. No. 6,258,141 reference discloses formation of a coating on an alumina grain from a salt-based precursor solution. Such a salt-based coating protects the abrasive grains during the formation of a bonded abrasive article in which the alumina grains are heated with a vitreous material, typically a silica glass material, which may penetrate the alumina grains at a high temperature. Notably, the coating is preferably used to prevent discoloration associated with low temperature vitreous bond materials which oftentimes leave a residue of carbon on the alumina grains causing a discoloration in the bonded abrasive product. Similarly, the U.S. Pat. No. 5,131,923 reference discloses the formation of an abrasive grain having a silica-enriched surface for improved bonding with a vitreous bond matrix having a high silica content. However, the effectiveness of the approaches taught by U.S. Pat. No. 6,258,141 and U.S. Pat. No. 5,131,923 are limited.

Accordingly, the industry continues to need fixed abrasives with improved properties. Properties of interest include, chemical and mechanical stability, operable lifetime, and fixed abrasive devices capable of providing the same grinding performance as conventional devices, if not improved grinding performance.

SUMMARY

According to one aspect a method of forming a fixed abrasive is provided which includes combining alpha alumina particulate with a shell-forming material and firing the alpha alumina with the shell-forming material to form abrasive particles. The abrasive particles have a core-shell structure that includes a polycrystalline alpha alumina core and a shell layer overlying the polycrystalline alpha alumina core. The shell layer includes a polycrystalline material selected from the group consisting of silicon oxide and zirconium oxide. Additionally, the polycrystalline alpha alumina core is made of grains having an average grain size of not greater than about 500 nm. The method also includes affixing the abrasive particles in a matrix material to form a fixed abrasive.

According to another aspect a fixed abrasive is provided which includes a matrix material and abrasive particles embedded in the matrix material. The abrasive particles have a core-shell structure that includes a polycrystalline alpha alumina core and a shell layer overlying the polycrystalline alpha alumina core. The shell layer includes a polycrystalline material selected from the group consisting of silicon oxide and zirconium oxide, and the polycrystalline alpha alumina core is made of grains having an average grain size of not greater than about 500 nm.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
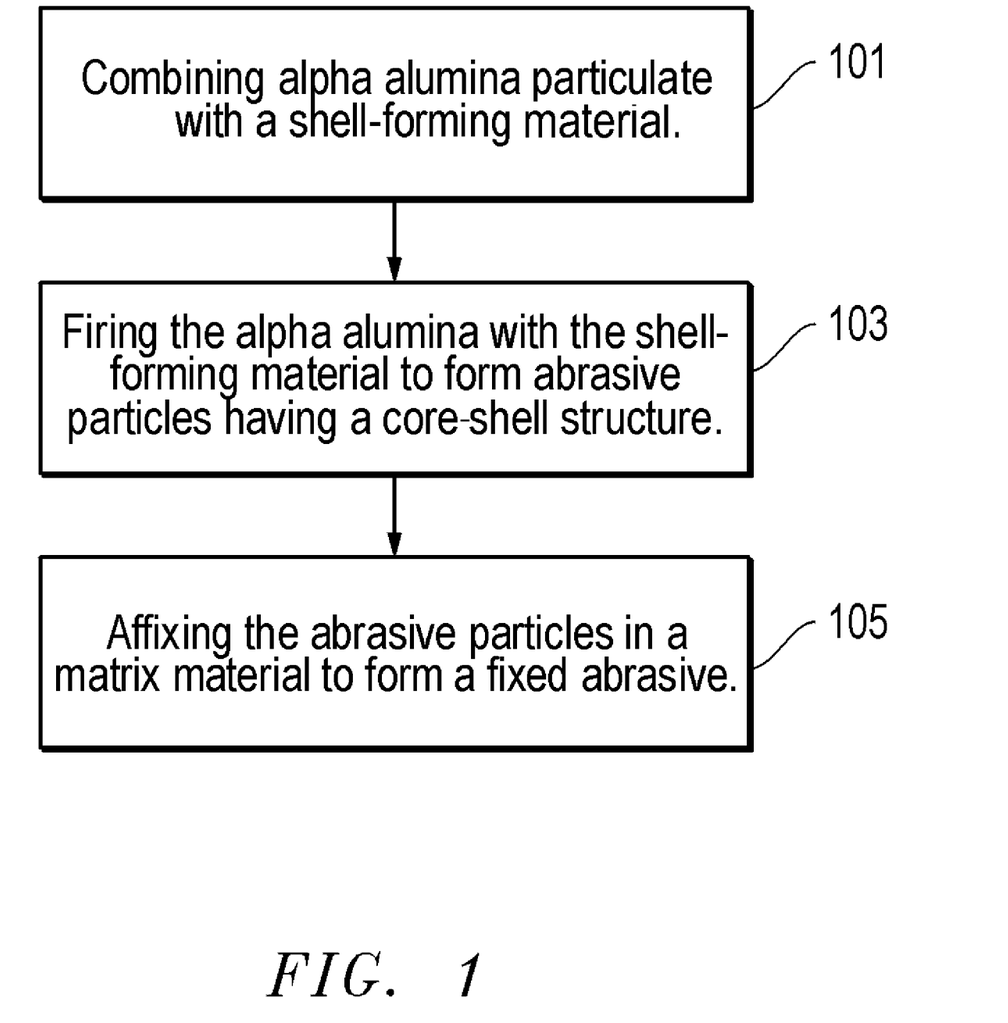
FIG. 1 is a flowchart illustrating a process for forming a fixed abrasive device according to one embodiment.

Referring to FIG. 1, a flow chart illustrating a process of forming a fixed abrasive according to one embodiment is provided. The process is initiated by combining an alpha alumina particulate with a shell-forming material 101. According to one particular embodiment, the alpha alumina particulate can be formed via a seeded sol-gel alumina processing pathway which may include multiple phase transformations.

Accordingly, the seeded sol-gel alumina processing pathway is initiated by utilizing an alpha alumina precursor material, such as a hydrated alumina, in a suspension. Generally, the liquid medium of the suspension is water. Seeds are then incorporated into the suspension to provide nucleation centers for the formation of alpha alumina grains. Generally, the seeds are submicron sized alpha alumina particles, provided in an amount of not greater than about 10 wt %, such as not greater than about 5.0 wt % or even not greater than about 3.0 wt %. The water is then removed from the suspension via drying at a temperature of between about 100° C. and 200° C. The remaining alpha alumina precursor material and alpha alumina seeds are then heated to a sufficient temperature (calcined) to induce conversion of the precursor material to alpha alumina particles. Generally, the heating temperature is greater than about 200° C., such as at a temperature of greater than about 400° C. and between about 600° C. and 1500° C. Impurities, such as other oxide species, that may exist in the converted alpha alumina may be removed via an ion exchange process.

The alpha alumina precursor material can be a hydrated form of alumina, such as boehmite. While the alpha alumina can be processed through a seeded processing pathway, the boehmite material can also be formed through a seeded processing pathway. The term "boehmite" is generally used herein to denote alumina hydrates including mineral boehmite, typically being $Al_2O_3 \cdot H_2O$ and having a water content on the order of 15%, as well as psuedoboehmite, having a water content higher than 15%, such as 20-38% by weight.

Generally, formation of boehmite through a seeded processing pathway is similar to the formation of alpha alumina particulate through a seeded processing pathway. The boehmite is provided in a suspension and heated. Heating can be carried out in an autogenous environment, that is, in an autoclave, such that an elevated pressure is generated during processing. The seed particles are typically present in an amount greater than about 1.0% by weight of the boehmite precursor (calculated as $Al_2O_3$), and heating is carried out at a temperature greater than about 120° C., such as greater than about 125° C., or even greater than about 130° C., and at a pressure that is autogenously generated, typically around 30 psi.

Additionally, the acidity of the suspension can be controlled to form boehmite seeds of a desired shape and size. The pH of the suspension is generally selected from a value of less than 7 or greater than 8, and the boehmite seed material has a particle size finer than about 0.5 microns. Several variables may be modified during the processing of the boehmite particulate material, to effect the desired morphology. These variables notably include the weight ratio, that is, the ratio of boehmite precursor to boehmite seed, the particular type or species of acid or base used during processing (as well as the relative pH level), and the temperature (which is directly proportional to pressure in an autogenous hydrothermal environment) of the system.

The conversion of the boehmite particulate material to alpha alumina may be carried out by calcining (as noted above). The calcining temperature is dependent, in part, upon the type of boehmite particulate material and the time necessary to convert the boehmite particulate material to the alpha alumina phase. Generally, the calcining temperature is not less than about 1100° C. Other embodiments utilize a calcining temperature that is not less than about 1200° C., 1300° C., or even 1400° C. Typically, the calcining temperature is within a range of about 1250° C. to about 1500° C.

A suitable time for calcining depends in part upon the boehmite particulate material and the desired composition of the alpha alumina material. Typically, calcining is not carried out for greater than about 5 hours, generally within a range of about 1 to 4 hours, or about 1 to 3 hours. Additionally, calcination may be carried out in various environments including controlled gas and pressure environments. Because calcination is generally carried out to effect phase changes in the boehmite particulate material and not chemical reaction, and since the resulting material is predominantly an oxide, specialized gaseous and pressure environments need not be implemented except for most compositionally and morphologically controlled alumina end products.

In reference to the alpha alumina, generally, the alpha alumina particles generally have a fine primary particle size, particularly submicron. According to one embodiment, the alpha alumina has a primary particle size of not greater than about 500 nm, not greater than about 300 nm, or even not greater than about 250 nm. Still, other embodiments utilize alpha alumina having a primary particle size of not greater than about 200 nm, or even not greater than about 150 nm. In another embodiment, the average primary particle size of the alpha alumina particulate is not greater than about 100 nm, or still, not greater than about 75 nm.

Referring again to FIG. 1, the alpha alumina particulate is combined with the shell-forming material 101. Generally, the shell-forming material includes a species for forming the shell layer, and more specifically, includes silicon or zirconium. According to a particular embodiment, the shell-forming material contains the metal oxide of such species, namely silicon oxide and zirconium oxide.

The alpha alumina may be combined with the shell-forming material in the form of a mixture. According to one embodiment, the mixture is a wet mixture including an aqueous vehicle. It will be appreciated that depending upon the desired method of mixing, be it wet or dry, the mixing can incorporate additional processes, such as for example, a milling process. In such embodiments utilizing a wet mixture, the alpha alumina particulate can be formed into a slurry or suspension with an aqueous solvent. Alternatively, in other embodiments, the solvent is non-aqueous, such as an organic compound.

In particular the alpha alumina particulate can be combined with the shell-forming material as a colloidal dispersion, which can include the shell-forming material as colloids suspended in a liquid medium. As such, the colloids can contain a metal oxide species for forming the shell layer, and particularly can include silicon oxide or zirconium oxide, which includes silica and zirconia. In one embodiment, the colloids are made up of not less than about 90% silicon oxide or zirconium oxide. In another embodiment, the colloids are essentially entirely silicon oxide or zirconium oxide.

In reference to the liquid vehicle, the colloidal dispersion may utilize an aqueous liquid vehicle. Alternatively, the liquid vehicle of the colloid can be an organic compound, and particularly can include acetate. The colloidal dispersion may contain additives in addition to the colloids and liquid vehicle, such as other inorganic compounds, organic compounds, stabilizers, pH modifiers, or binders. Such additives typically comprise not greater than about 15 wt % based upon the total solids content of the dispersion. According to other embodiments, the amount of such additives is not greater than about 10 wt %, or not greater than about 5.0 wt %.

To facilitate formation of the colloidal dispersion using the shell-forming material, the primary particle size of the colloids is small, generally submicron. According to one embodiment, the colloids have an average primary particle size of not greater than about 200 nm, such as not greater than about 150 nm, or even not greater than about 100 nm.

According to one embodiment, the amount of alpha alumina particulate combined with the shell-forming material is not less than about 80 wt % based upon a total solids content of alpha alumina and the shell-forming material. In another embodiment, the amount of alpha alumina is not less than about 90 wt %, and in some cases not less than about 95 wt %. Accordingly, the amount of shell-forming material that is combined with the alpha alumina is not greater than about 20 wt % based upon the total solids content of alpha alumina and the shell-forming material. Still the amount of shell-forming material may be less, such that it is not greater than about 10 wt %, or not greater than about 5.0 wt %, or even not greater than about 3.0 wt %. Typically, the amount of shell-forming material is not less than about 0.25 wt %.

After the alpha alumina particulate and shell-forming materials are combined, the mixture can be dried. The drying temperature is generally within a range suitable for evolving and evaporating components from the mixture, particularly organic components and other components. According to one embodiment, the mixture is dried at a temperature greater than about room temperature, that is not less than about 25° C. According to another embodiment, drying is completed at a temperature of not less than about 35° C., not less than about 40° C., or even not less than about 50° C. According to a particular embodiment, drying can be carried out at a temperature within a range of between about 25° C. and about 100° C.

Combining the shell-forming material with the alpha alumina particulate can be undertaken using alternate methods. For example the shell forming material may be combined with the alpha alumina particulate using a deposition process. According to one embodiment, the shell-forming material can be deposited via a vapor deposition process, including for example, chemical vapor deposition CVD, plasma vapor deposition PVD, or metal organic chemical vapor deposition MOCVD. In such embodiments utilizing a vapor deposition process, the shell forming material can be provided as a precursor material. The precursor material can include the shell-forming material or a derivative of the shell-forming material, such that when the precursor material is reacted or decomposed during the deposition process it forms a shell layer, particularly a shell layer including silicon oxide or zirconium oxide. According to one embodiment, the precursor material comprises silicon, and particularly is tetraethyl orthosilicate (TEOS).

After combining the components, the combination can be fired to form abrasive particles 103. Firing the components aids conversion of the shell-forming material to a shell layer overlying the polycrystalline alpha alumina core. Particularly, the shell-forming material can be converted to a high temperature compound, such as a metal oxide compound, which can be a polycrystalline form. Generally, firing of the components is completed at a temperature not less than about 800° C. Still, according to one embodiment, the firing temperature is not less than about 1000° C., but typically not greater than about 1400° C. In one particular embodiment, the firing temperature is within a range of between about 800° C. and about 1200° C.

Firing of the components generally facilitates formation of a bond between the shell layer and the alumina core. The bond may be a primary bond, particularly the shell layer can be bonded to the alumina core via a primary bonding mechanism, such as covalently bonded. Moreover, firing facilitates densification of the abrasive particle and the formation of a coherent and polycrystalline shell layer.

In reference to the abrasive particles as a whole (i.e., core and shell) it will be appreciated that after firing the abrasive particles can be screened through meshes to obtain abrasive particles of a particular size and/or distribution, be it coarse, fine, or a mixture thereof. The final size of the abrasive particles is determined in part by the size and distribution of the initial alpha alumina particulate, and moreover, it will be appreciated that control and production of the size of the alpha alumina particles provides control of the size of the final abrasive particles. Accordingly, the abrasive particles can be larger particles in comparison to the submicron crystalline grains of alpha alumina that form the core. Generally, the size of the abrasive particles post firing is not greater than about 1.7 mm. In one embodiment, the abrasive particles have an average particle size of not greater than about 1.0 mm, such as not greater than about 500 microns, or even, not greater than about 400 microns.

After firing 103, the abrasive particles can be affixed to a matrix material to form a fixed abrasive 105. Generally, a fixed abrasive is defined herein as a component in which the abrasive particles or abrasive grains are fixed in position, generally fixed in position relative to each other (bonded abrasive), or fixed in position relative to each other and to a backing member (coated abrasive). The actual configuration of the fixed abrasive may vary widely depending upon the application. For example, coated abrasives may utilize a paper, cloth, stitch bonded cloth, fiber or film backing, and the coated abrasive may take on several different geometric forms, including belts, discs, sheets, interlined sleeves, rolls, flap discs, flap wheels, and other geometric configurations. On the other hand, bonded abrasives are typically in the form of solid, integrated structures, such as in the form of grinding wheels, cylindrical wheels, cup wheels, dish wheels, segments, cones, mounted wheels, and points, bricks, and sticks.

Figure 2:
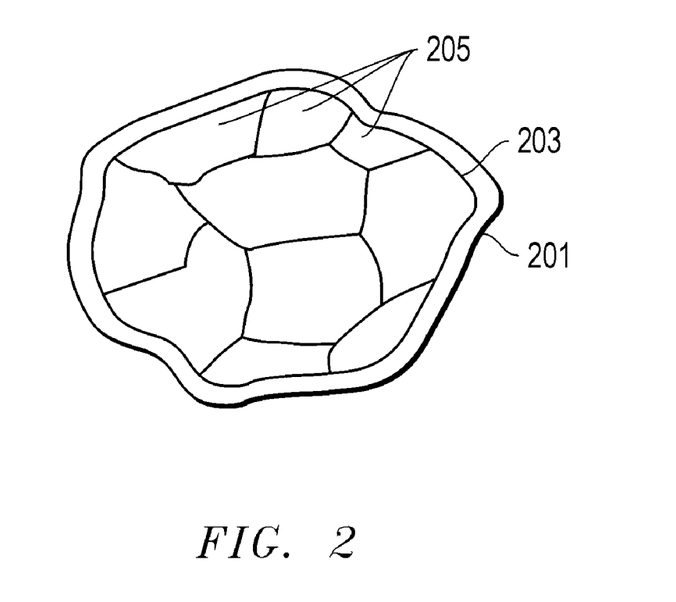
FIG. 2 is an illustration of a coated abrasive grain according to one embodiment.

Referring to FIG. 2, a cross-sectional illustration of an abrasive particle according to one embodiment is depicted. As described herein and according to one embodiment, the abrasive particle has a core-shell structure including a core 203 made of a plurality of alpha alumina grains 205. Generally, the core 203 includes not less than about 95% alpha alumina, or not less than about 98% alpha alumina. Still, in one particular embodiment, the core 203 is made essentially of alpha alumina.

The polycrystalline core 203 includes a plurality of alpha alumina crystalline grains which are quite small, and generally of a submicron grain size. In one embodiment, the alpha alumina grains have an average size of not greater than about 500 nm, such as not greater than about 400 nm, or even, not greater than about 300 nm. According to another embodiment, the core 203 includes grains 205 having an average grain size of not greater than about 200 nm, such as not greater than about 150 nm, and in some cases not greater than about 100 nm.

In further reference to the core 203 of the abrasive particles, generally the average size of the core 203 is not greater than about 1.7 mm, such as not greater than about 750 microns, or even, not greater than about 600 microns. According to one particular embodiment, the average core size of the abrasive particles is not greater than about 500 microns, or even not greater than about 200 microns. In particular, the average core size is within a range between about 0.5 microns and about 1.7 mm.

As illustrated in FIG. 2, the shell layer 201 includes a polycrystalline material that is overlying the core 203. Generally, the shell layer 201 can be not less than about 90 vol % polycrystalline material, and more typically can include not less than about 98 vol % polycrystalline material. According to on embodiment, the shell layer 201 consists entirely of a polycrystalline material.

Typically, the shell layer 201 substantially encapsulates the alpha alumina core 203, such that the shell layer 201 is overlying not less than about 90% of the external surface of the core 203. Still, in other embodiments, the shell layer 201 can encapsulate more of the core 203, such that not less than about 95% of the external surface of the core 203 is covered by the shell layer 201. While in another embodiment, the shell layer 201 covers not less than about 98% of the external surface of the core 203. In one particular embodiment, the shell layer 201 substantially encapsulates the alpha alumina core 203 such that essentially all of the external surface of the core 203 is covered by the shell layer 201.

The shell layer 201 overlies the core 203 and according to one embodiment, the shell layer 201 has an average thickness of not greater than about 10 microns. Still, the shell layer may be thinner, and in another embodiment, the shell layer 201 has an average thickness of not greater than about 8.0 microns, such as not greater than about 5.0 microns. In one particular embodiment, the shell layer 201 has an average thickness of not greater than about 3.0 microns.

The shell layer 201 is a generally robust layer can be a significant fraction of the total weight of the abrasive particles. According to one embodiment, the shell layer 201 is not less than about 0.5 wt % of the total weight of the particle. In another embodiment, the shell layer 201 can be not less than about 1 wt % of the entire weight of the abrasive particle, such as not less than about 3 wt %, or even not less than about 5 wt %. According to a particular embodiment, the shell layer 201 is a robust layer being a significant portion of the abrasive particle such is has a weight within a range between about 1 wt % and about 10 wt % of the total weight of the abrasive particle.

In further reference to the shell layer 201, generally the shell layer 201 is a particularly dense layer, having little porosity and such porosity being generally closed porosity. According to one embodiment the shell layer 201 has a porosity of not greater than about 30 vol %. According to another embodiment, the shell layer 201 has a porosity that is not greater than about 20 vol %, such as not greater than about 15 vol %, or not greater than about 10 vol %. Still, in one particular embodiment, the porosity of the shell layer 201 is not greater than about 5.0 vol %.

As described previously, the shell layer 201 includes the shell-forming material and particularly includes a metal oxide compound of either zirconium oxide or silicon oxide. Zirconium oxide and silicon oxide include oxides of zirconium or silicon, such as for example, zirconia or silica, or compound oxides of silicon and zirconium, possibly including reaction products with the underlying alumina core. According to one embodiment, the abrasive particles have a shell layer 201 that comprises not less than about 90% zirconium oxide, such as not less than about 95% zirconium oxide, and still in some cases not less than about 98% zirconium oxide. Still, in one particular embodiment, the shell layer 201 is made entirely of zirconium oxide.

In reference to the embodiments utilizing a zirconium oxide shell layer, generally, the zirconium oxide shell layer is polycrystalline. Moreover, the crystalline phase of the zirconium oxide according to one embodiment, is an unstabilized form. Particularly, embodiments utilizing a shell layer 201 made entirely of zirconium oxide utilize an unstabilized form of zirconia, and accordingly, the zirconia can have a monoclinic crystal structure. Still, other embodiments can utilize a shell layer 201 including zirconia which has a tetragonal or cubic crystal structure.

According to other embodiments, the shell layer 201 can include silicon oxide, and particularly a polycrystalline form of silicon oxide. Generally, the shell layer 201 includes not less than about 90% silicon oxide. In another embodiment, the shell layer 201 includes not less than about 95% silicon oxide, such as not less than about 98% silicon oxide. Still, the shell layer 201 can include more silicon oxide such that the shell layer 201 is made entirely of silicon oxide.

Figure 3:
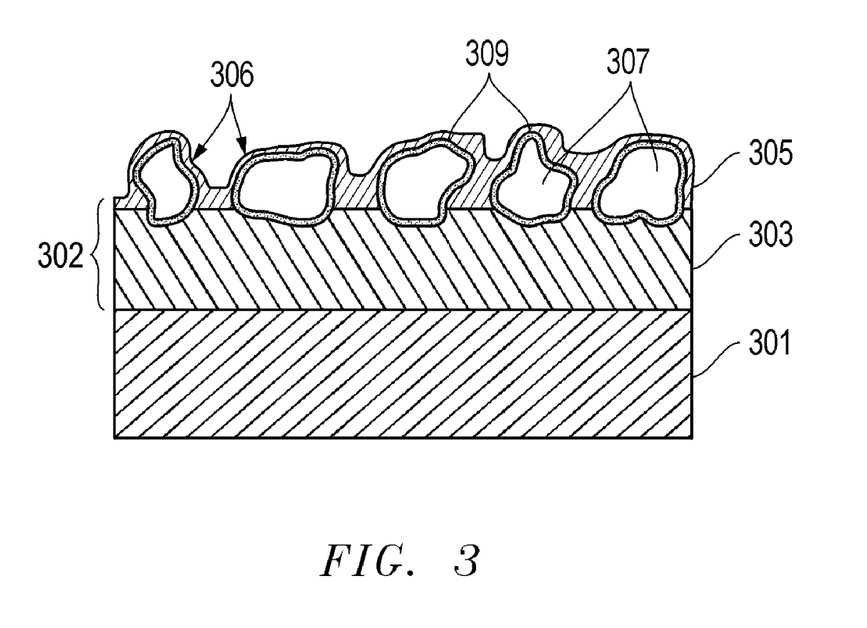
FIG. 3 is an illustration of a cross-section of a coated abrasive article according to one embodiment.

Referring to FIG. 3 a cross-section of a coated abrasive article is illustrated. As illustrated, the coated abrasive includes a backing member 301, a matrix material 302 having a first layer 303 and a second layer 305, and abrasive particles 306 having a core 307 and a shell layer 309 overlying the core 307. Generally, as with most coated abrasive articles, the backing material 301 is a planar material adjacent to and overlying the matrix material 302 which provides a surface for holding the matrix material 302 and also the abrasive particles 306. The backing material 301 generally incorporates a flexible yet tough material capable of withstanding the particular mechanical demands of a grinding or polishing application. According to one embodiment, the backing material 301 includes materials such as ceramics, polymers, metals, synthetic fibers, and natural fibers, such as paper or cotton, or a combination thereof. According to another embodiment, the backing material is a synthetic material, such as a polymer, like polyester, nylon, or rayon. Additionally, the backing material 301 can include a woven material, which can include a synthetic woven material, naturally woven material, or a combination of both. Moreover, such woven materials can be held together by a resin or polymeric compound. Still, other embodiments utilize a film such as a polyester film to form the backing material 301.

Referring again to the matrix material 302 of the coated abrasive, generally the matrix material 302 is adjacent to and overlying the backing material 301, and provides a surface to which the abrasive particles 306 can be attached. In one embodiment, the matrix material 302 includes a plurality of layers, which are generally adhesive layers, such as the first layer 303 and second layer 305 illustrated in FIG. 3. Generally, the first layer 303 is referred to as a "make coat" and facilitates affixing the abrasive grains in place relative to the backing material 301. According to one embodiment, the first layer 303 can include a resin or an adhesive, or both. The term resin refers to a synthetic compound that is cured, and can include a natural or synthetic material. According to one embodiment, the first layer comprises resins such as urea resin and phenolic resin, or a combination thereof. The composition and percentages of resin and adhesive present within the first layer 303 facilitates control of the rigidity of the layer, which will be determined as needed depending upon the desired application. Abrasive particles 306 are then affixed within the first coat prior to hardening or curing of the material of the first layer 303. The abrasive particles may be aligned or affixed within the first layer 303 in a particular arrangement or pattern.

In addition to the first layer 303, the matrix material 302 can also include a second layer 305, as illustrated in FIG. 3, overlying the abrasive particles 306 and the first layer 303. Generally, the second layer 305 can be referred to as a "size coat" and facilitates fixing the abrasive particles 306 within the first layer 303 relative to each other. Accordingly, the second layer 305 can include a resin and adhesive, which may include polymeric compounds including for example, urea resin or phenolic resin.

In addition to the resinous and adhesive compounds, the second layer 305 can also include additional compounds, such as fillers. Fillers can include additional performance enhancing compounds, such as a solid lubricant. According to one embodiment, the second layer 305 includes a halogen compound, and more particularly, a fluorine compound. In one particular embodiment, the filler includes a compound comprising sodium, aluminum, and fluorine (e.g., Cryolite®). Such filler materials containing halogens such as fluorine are corrosive, and can be particularly corrosive at high temperatures that are prevalent during a grinding operation, which can improve the grinding performance of the fixed abrasive device, but also simultaneously corrode and alter the abrasive grains.

According to a particular embodiment, the coated abrasive is a closed coat article having abrasive particles covering not less than about 75% of the useable surface of the coated abrasive. Still, the closed coat article may have a higher density of abrasive grains across the surface, such as abrasive grains covering not less than about 80%, or even not less than about 90% of the useable surface of the coated abrasive. Alternatively, in other embodiments, the coated abrasive article is an open coat article having abrasive particles covering less than about 75% of the useable surface of the coated abrasive. In one embodiment, the coated abrasive is an open coat abrasive having abrasive particles covering less than about 65%, such as less than about 55%, or even less than about 45% of the useable surface of the coated abrasive. Generally, the open coat abrasive article has a majority of the useable surface covered with abrasive particles, such as within a range of between about 50% and about 75%.

Figure 4:
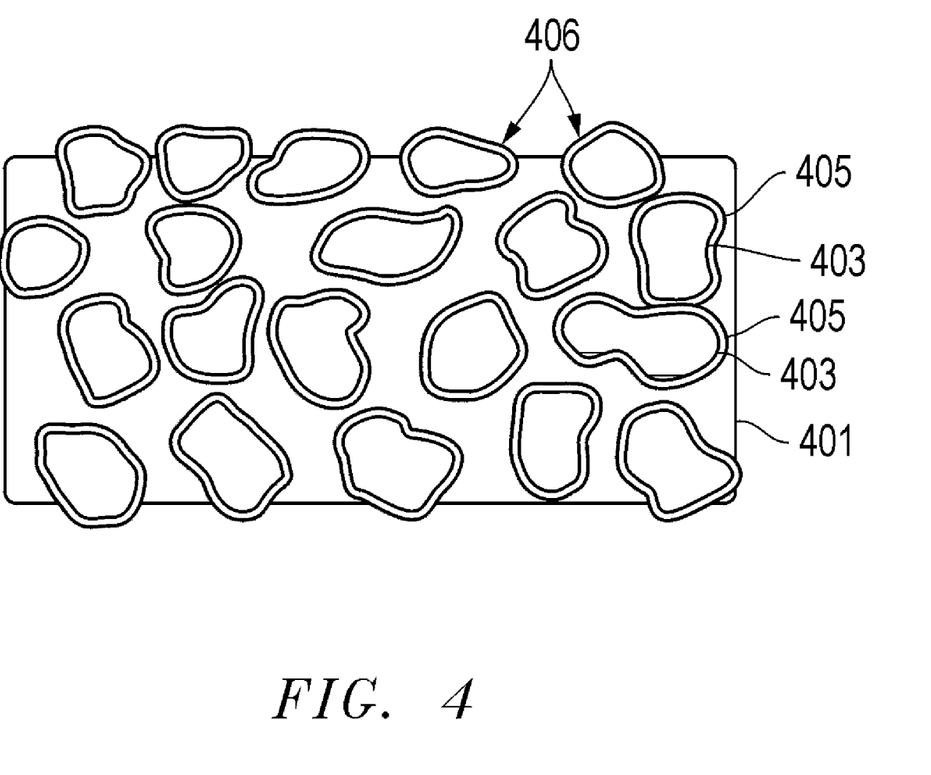
FIG. 4 is an illustration of a cross-section of a bonded abrasive article according to one embodiment.

Referring now to other fixed abrasive articles, FIG. 4 is a cross-sectional illustration of a bonded abrasive article according to one embodiment. As illustrated, the bonded abrasive includes a matrix material 401 having abrasive particles 406 embedded therein. The abrasive particles 406 illustrated include particles having a core 403 and a shell layer 405 overlying the core 403.

Referring to the matrix material 401 of the bonded abrasive, generally the matrix material includes a material suitable for holding the abrasive particles 406 in place relative to each other. According to one embodiment, the matrix material 401 includes materials such as ceramics, metals polymers, and/or natural materials, such as rubber. In one embodiment, the matrix material 401 can include a synthetic material, such as a resin which may include a phenol material. According to another embodiment, the matrix material includes a ceramic, such as a glassy or vitrified ceramic material. According to a particular embodiment, the vitrified matrix material includes silica, generally in an amount of not less than about 10 wt %, such as not less than about 30 wt %, or still not less than about 60 wt % silica.

Generally, bonded abrasives having a vitrified ceramic matrix material are made by employing the steps of mixing together abrasive particles, vitreous or ceramic bond precursor ingredients (e.g. frit, oxides and silicates), and a temporary binder, then placing such a mixture in a mold and pressing the mixture in the mold to approximately the desired size and shape. The process extracts volatiles from the pressed piece, usually by heating the pressed piece at a relatively low temperature (e.g. 200° C. to 300° C.) to evolve any volatiles (e.g., water and/or organic materials) before a final firing step to reduce expansion and bloating of the bonded abrasive article.

After the initial pressing and heating, the bonded abrasive is removed from the mold and then fired at a relatively high temperature (e.g. 500° C. to 1200° C.) in a furnace to form the vitreous bond to facilitate binding of the abrasive particles and the matrix material. Firing of the pressed, temporarily bound (i.e. green) piece usually is done at temperature of not less than about 500° C., such as not less than about 700° C., or even not less than about 900° C., and generally within a range of between about 500° C. to about 1200° C. During this high temperature firing, various physical and/or chemical transformations occur resulting in the formation of a vitreous or ceramic matrix that binds together the abrasive grains and the matrix material.

The matrix material 401 of the bonded abrasive article, particularly bonded abrasives that utilize a vitrified ceramic matrix material include not less than about 30 wt % of the matrix material based upon the total weight of the bonded abrasive article. According to another embodiment, the matrix material 401 comprises not less than about 40 wt %, or not less than about 50 wt %, or in some cases not less than about 60 wt % of the entire weight of the bonded abrasive article.

Figure 5:
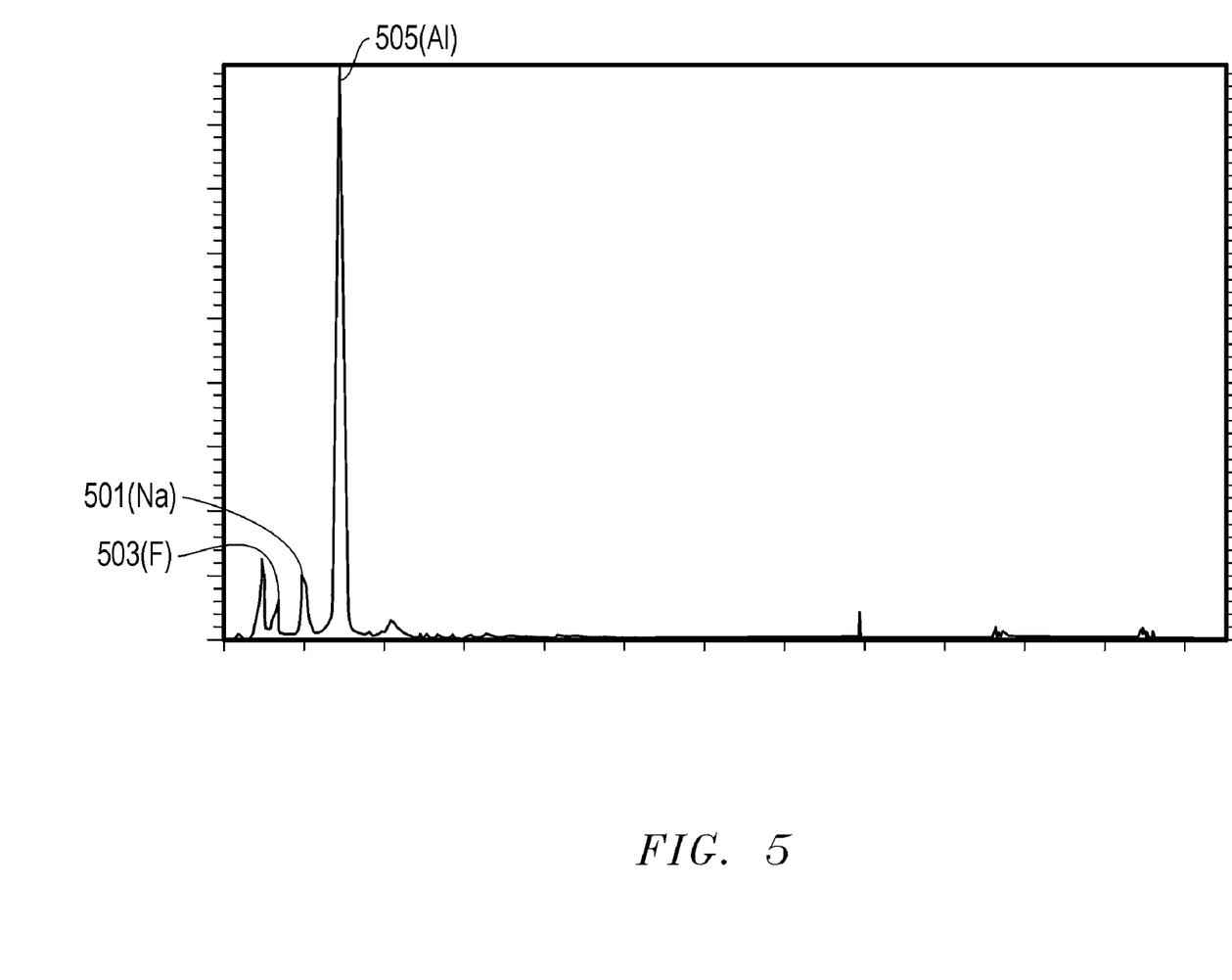
FIG. 5 is a plot of elements present within a conventional alumina grain incorporated into a fixed abrasive device.

In reference to abrasive particles as used in fixed abrasive articles, FIG. 5 illustrates a plot of elements present within conventional alumina particles affixed within a coated abrasive article. Particularly, the coated abrasive includes a filler material having sodium (Na) and fluorine (F) as primary components (e.g., Cryolite®). Moreover, the alumina grains within the coated abrasive have an average crystal size of less than about 500 nanometers. Referring to FIG. 5, the alumina grains contain a high amount of aluminum 505 as would be expected, and in addition to the aluminum content, the alumina grains also exhibit a high amount of fluorine 503 and sodium 501. As mentioned, such elements are present in the filler material within the matrix material of the coated abrasive, and as evidenced by FIG. 5 these elements have penetrated the alumina grains.

Figure 6:
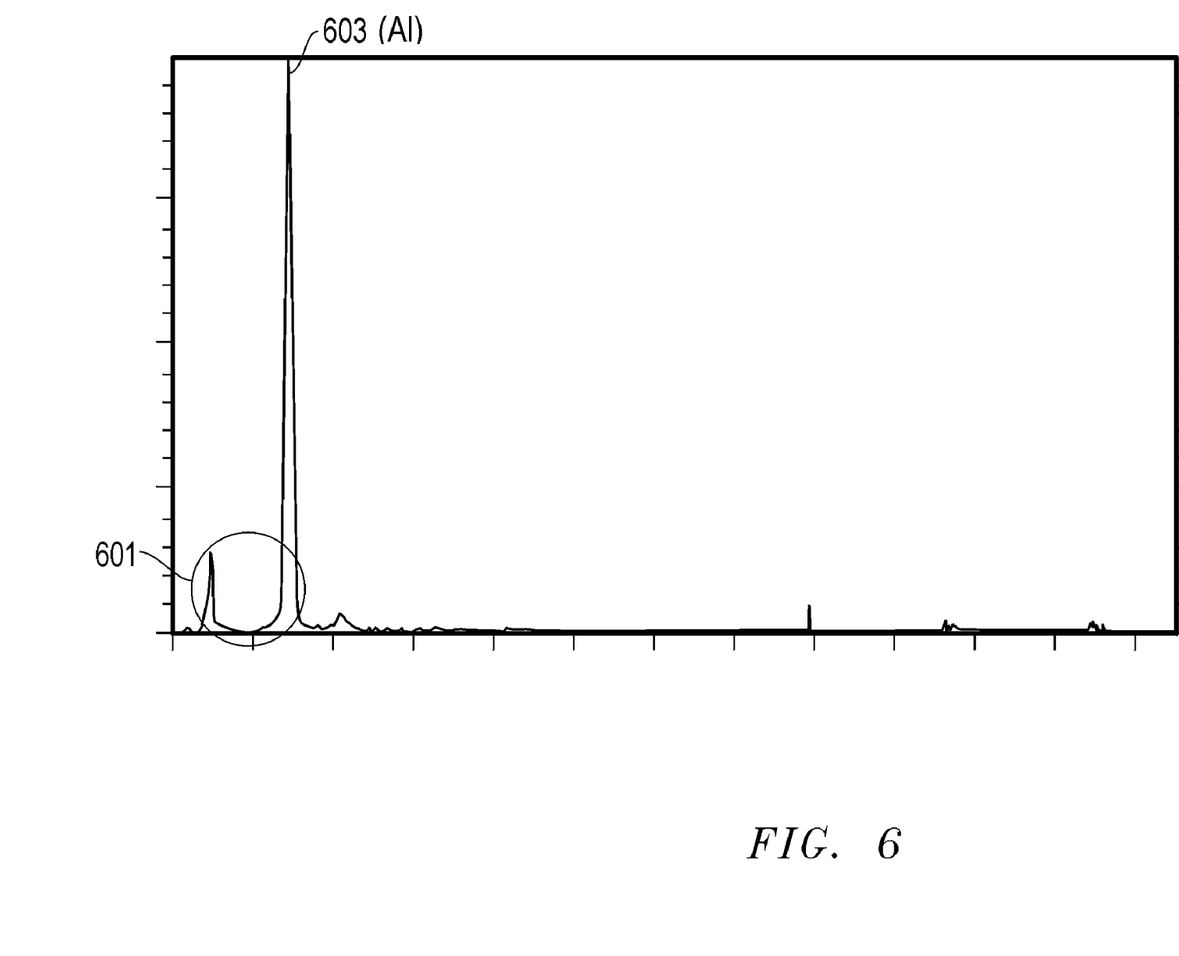
FIG. 6 is a plot of elements present within an alumina grain incorporated into a fixed abrasive device formed according to one embodiment.

For comparative purposes, FIG. 6 illustrates a plot of elements present within an abrasive particle which has been incorporated into a coated abrasive according to embodiments herein. Particularly, the abrasive particle illustrated in FIG. 6 has a core-shell structure, including an alpha alumina core and a shell layer comprising zirconia. The particles were fired at 1000° C. for five minutes. Like the coated abrasive evaluated in FIG. 5, the coated abrasive article of FIG. 6 incorporated the same filler material in the second layer of the matrix material, namely a filler made primarily of sodium and fluorine. While the alumina core of the abrasive particles provided in FIG. 6 contains a high content of aluminum 603 as expected, the alumina core exhibits very little, or no amount, of fluorine or sodium, as indicated in region 601. FIG. 6 in comparison with FIG. 5 indicates that elements present within the filler did not penetrate the alumina cores of the abrasive particles.

Figure 7:
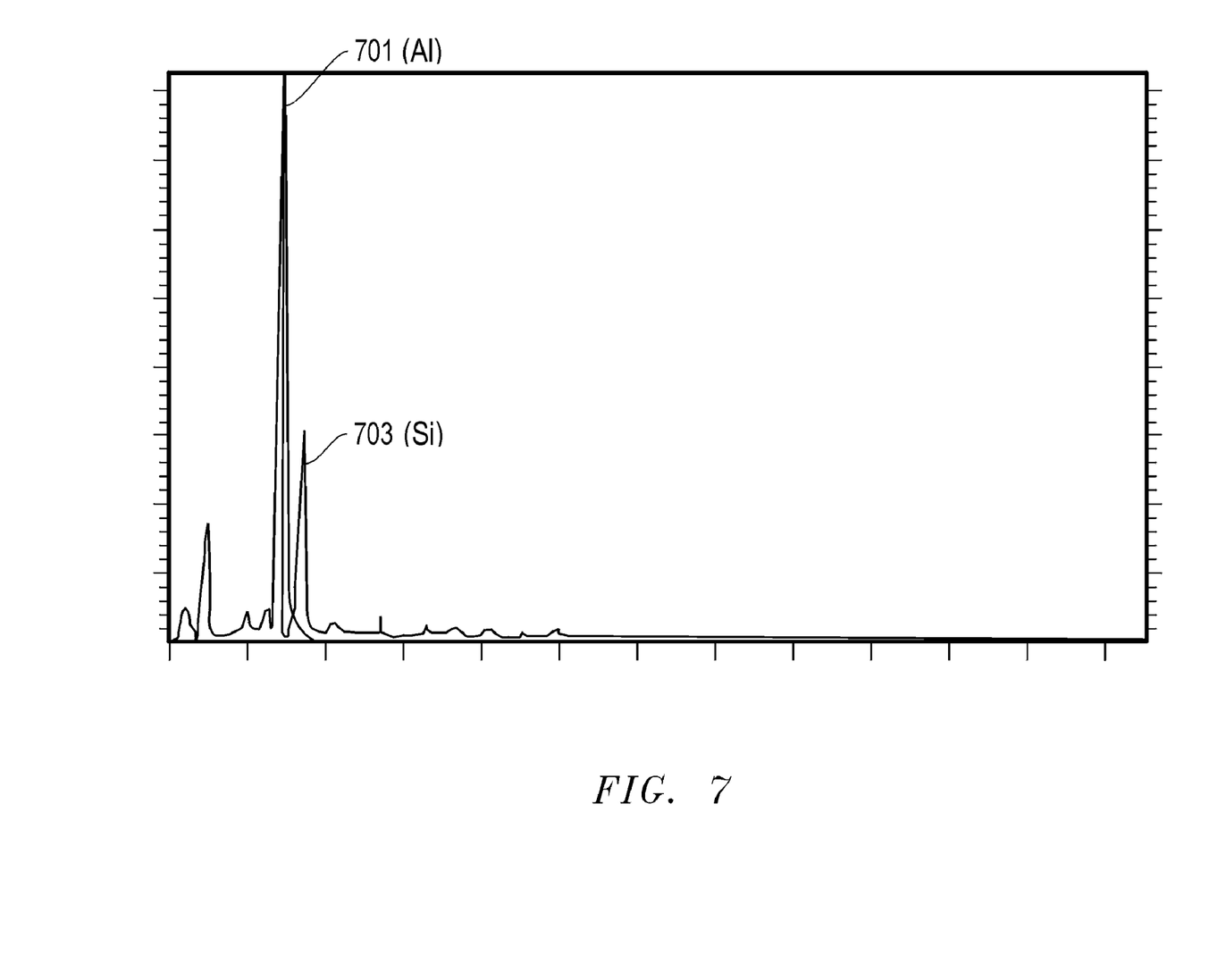
FIG. 7 is a plot of elements present within a conventional alumina grain incorporated into a fixed abrasive article.
Figure 8:
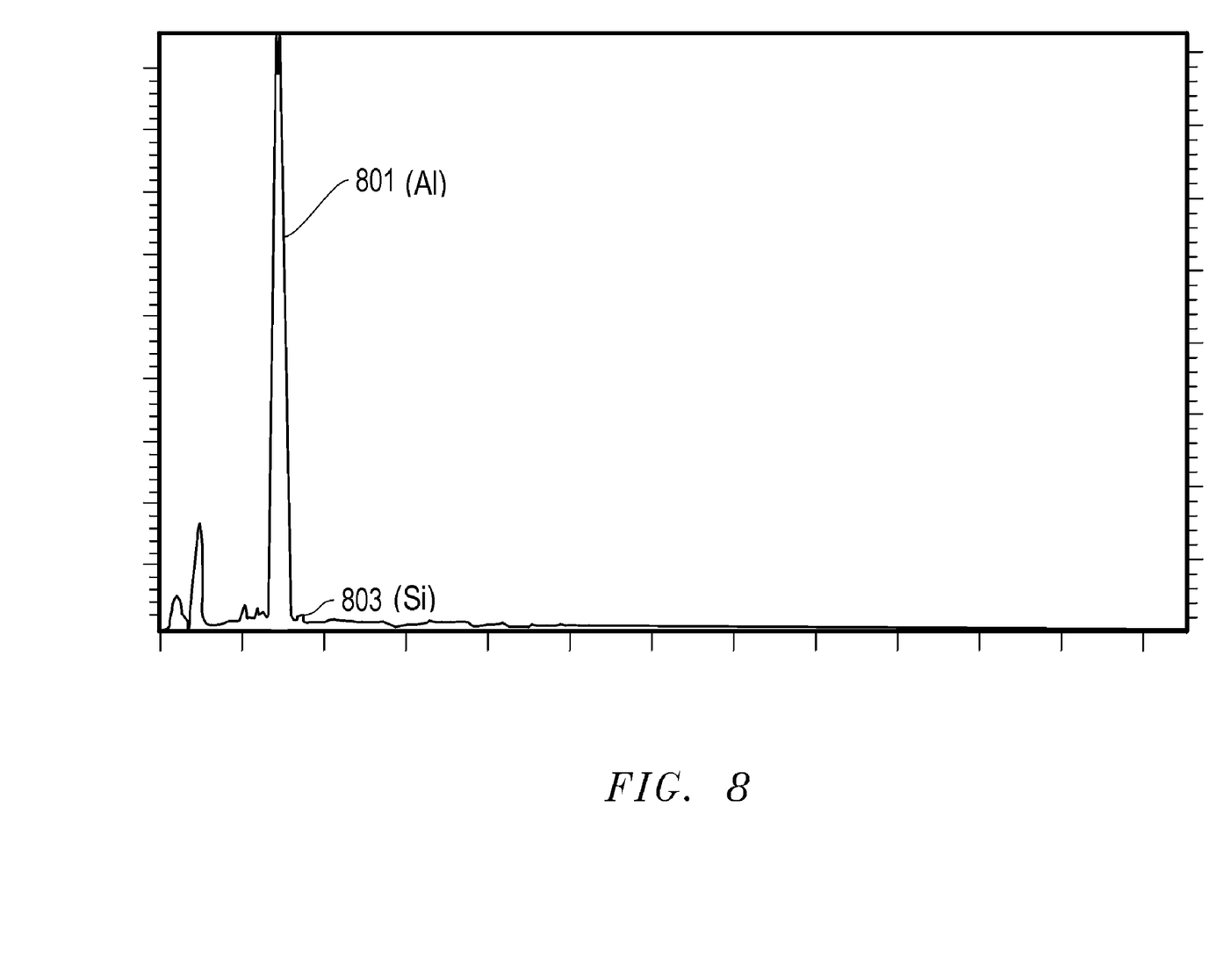
FIG. 8 is a plot of elements present within an alumina grain incorporated into a fixed abrasive device formed according to one embodiment.

In further reference to particular characteristics of the abrasive grains, FIG. 7 illustrates a plot of elements present within a conventional alumina grain and incorporated into a bonded abrasive article. By comparison, FIG. 8 illustrates a plot of elements present within an abrasive grain having a core-shell structure and incorporated into a bonded abrasive in accordance with embodiments herein. Particularly, the abrasive particles of FIG. 8 comprise a polycrystalline alpha alumina core having alumina grains of an average grain size of less than about 500 nm and a shell layer comprising zirconia. The abrasive particles were formed by firing at 1250° C. for four hours. Both samples illustrated in FIG. 7 and FIG. 8 incorporated a bonded abrasive having a vitrified matrix material containing silica. FIG. 7 illustrates that in addition to an expected high content of aluminum 701, the alumina particles contain a high content of silicon 703, indicating that elemental silicon from the silica of the matrix material penetrated the abrasive grain. By comparison, the abrasive particles of FIG. 8 illustrate a high content of aluminum 801, as expected, but the content of silicon 803 within the alpha alumina cores is reduced and demonstrates less silicon penetration into abrasive particles utilizing a core-shell structure.

Figure 9:
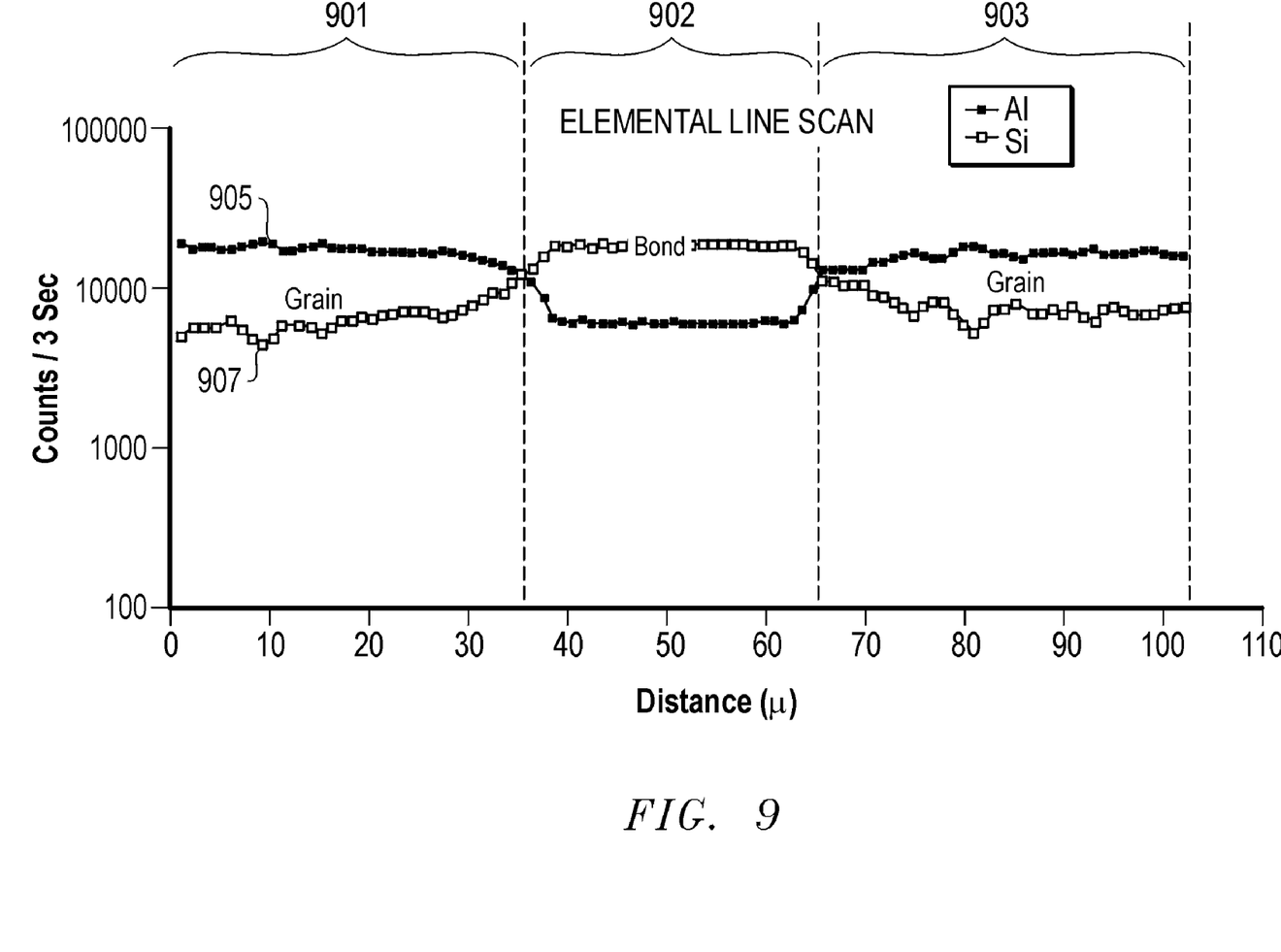
FIG. 9 is a plot of an elemental line scan of a region across a conventional bonded abrasive article.

In further reference to the characteristics of the abrasive particles provided herein, FIG. 9 illustrates an elemental line scan of a portion of a conventional bonded abrasive, utilizing bare alumina grains within a vitreous matrix material having a high content of silica. Regions 901 and 903 represent regions of the bonded abrasive that are abrasive grains of alumina, while region 902 represents a region of the bonded abrasive that is vitrified matrix material comprising silica. Accordingly, line 907 represents the amount of silicon within each of the regions and line 905 represents the amount of aluminum within each of the regions. As illustrated, the amount of aluminum within regions 901 and 903 (regions represented by the abrasive grains of alumina) is higher than the amount of silicon, but the amount of silicon moving from region 901 (an alumina grain) to region 902 (the matrix material), and again to region 903 (an alumina grain) changes only slightly.

Figure 10:
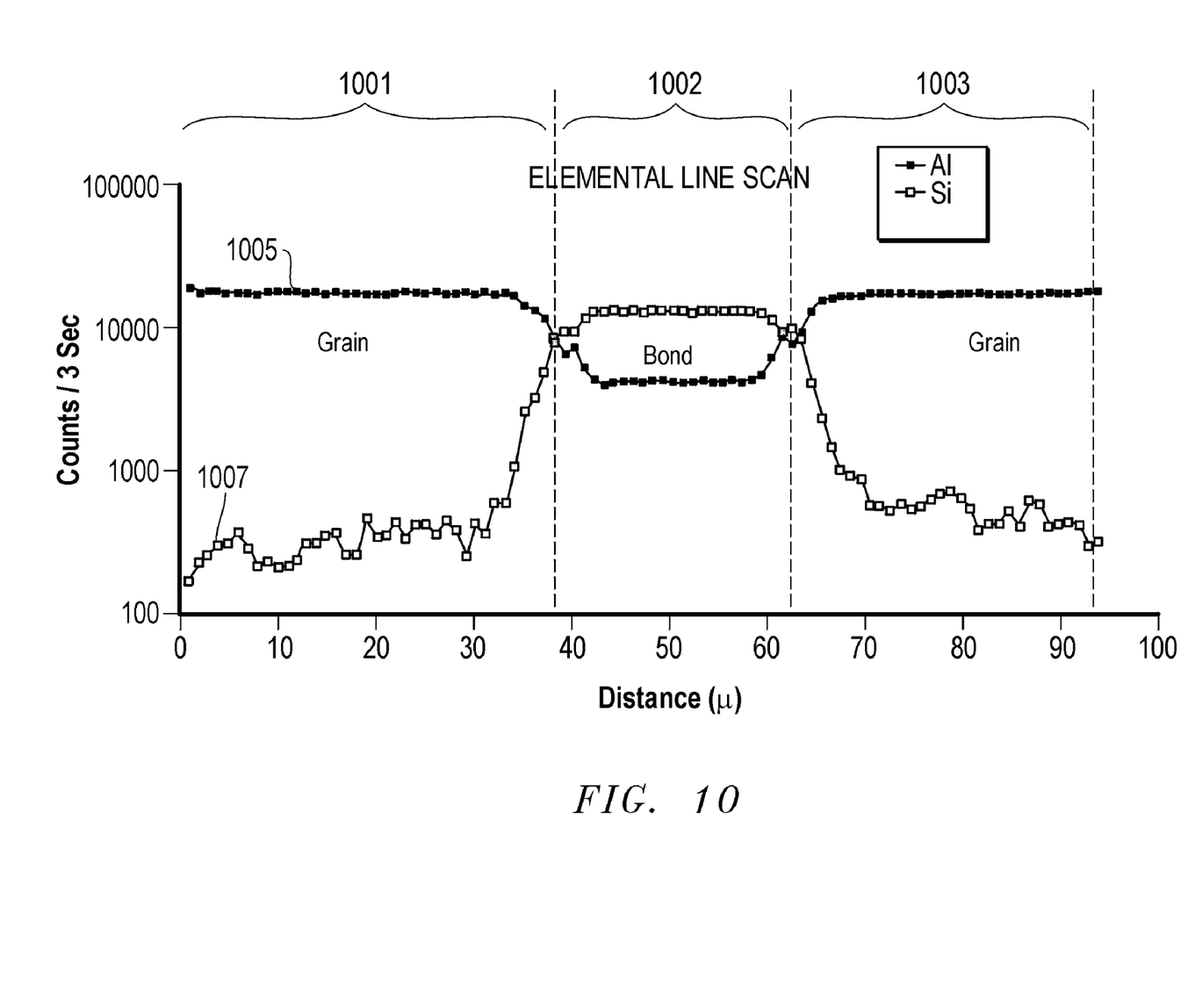
FIG. 10 is a plot of an elemental line scan of a region across a bonded abrasive article formed according to one embodiment.

By comparison, FIG. 10 illustrates a similar scan of a bonded abrasive having the same vitrified matrix material incorporating silica, and also incorporating abrasive grains having a core shell structure. Notably, the abrasive grains include a polycrystalline alpha alumina core and a zirconia shell layer. Like FIG. 9, FIG. 10 provides regions 1001 and 1003 which are regions of abrasive grains, and region 1002 represents a region of the matrix material. Accordingly, line 1007 represents the amount of silicon within each of the regions and line 1005 represents the amount of aluminum within each of the regions. Notably, the amount of silicon 1007 within the regions of the abrasive grains 1001 and 1003 drops dramatically from the region of the matrix material 1002. Moreover, by comparison to FIG. 9, the amount of silicon 1007 present within the abrasive grains of FIG. 10, notably within regions 1001 and 1004 contain less silicon than the abrasive grains of FIG. 9 (regions 901 and 903).

In further reference to the performance of fixed abrasive articles as provided in embodiments herein, Table 1 is provided below which demonstrates the grinding performance of abrasive particles in a Single Layer Test. The single layer test is a surface grinding test which is used as a simulation test to determine the performance of bonded abrasive and coated abrasives against select metal workpieces. In particular, Table 1 measures the grinding performance in terms of a G-ratio, a standardized method of measuring the grinding performance of an abrasive article, typically an abrasive wheel, which is a measure of the volume of the material removed from a sample as compared to the volume of material removed from the abrasive wheel. Each result provided below is measured as a percentage of the grinding performance against the Standard Alumina 1 sample which is also used as standard alumina abrasive particles within a vitrified matrix material.

TABLE 1

| Sample | G-Ratio (%) |
| --- | --- |
| Standard Alumina 1 | 100 |
| Standard Alumina 2 | 89 |
| S1 | 119 |
| S2 | 115 |
| S3 | 103 |
| S4 | 121 |
| Standard Alumina 3 | 104 |
| S5 | 126 |
| S6 | 132 |

The abrasive wheels used for the testing include a metal wheel, 5 inches in diameter and 0.25 inches thick having a single layer of abrasive particles attached to the surface of the metal wheel using phenolic resin as an adhesive material. The abrasive particles all samples in Table 1 are sieved and collected such that the particle size of the abrasive particles is within a range between 250 microns and 425 microns (between standard 60 and 40 mesh sizes) The difference in the abrasive particles is that the Standard Alumina 1, Standard Alumina 2, and Standard Alumina 3 samples used conventional bare alumina grains. The samples S1-S6 used abrasive particles having a core-shell structure as described in embodiments herein.

Each of the samples are tested under the same conditions including use of a 4140 carbon steel workpiece, fed at a constant rate at a 0.0001 inch constant feed, and a table speed of 65 feet/min. During testing grinding conditions also include dry, traverse, and a stopped power of 345 W to 350 W.

Referring to particular comparative samples, sample S1 incorporates abrasive particles utilizing alumina grains similar to those of the Standard Alumina 2 sample, but including a shell layer overlying the alumina grains which is formed from silica. Particularly, the shell layer was formed by mixing 0.5 wt % silica (based on the total solids content) to an alpha alumina particulate and firing the mixture at 1000° C. As illustrated, sample S1 demonstrated improved grinding performance, having an improved G-ratio of 19% over the Standard Alumina 1 sample, and 30% over the Standard Alumina 2 sample. Additionally, sample S1 illustrates improved grinding performance over each of the Standard Alumina 3 sample.

In reference to the next comparative sample, sample S2 incorporates abrasive particles utilizing alumina grains similar to those of the Standard Alumina 2 sample, but including a shell layer overlying the alumina grains which is formed from silica. Particularly, the abrasive particles of sample S2 were formed by combining alpha alumina with 1.0 wt % silica (based on the total solids content) as shell-forming material and firing the mixture at a temperature of 1000° C. As illustrated, sample S2 also demonstrated improved grinding performance over each of the Standard Alumina samples.

Like comparative samples S1 and S2, sample S3 is a bonded abrasive incorporating abrasive grains having a core-shell structure. Notably, sample S3 includes abrasive grains having a polycrystalline alpha alumina core and a shell layer overlying the polycrystalline core. The abrasive particles were made by combining alpha alumina particulate and 0.5 wt % silica (based on the total solids content) as a shell-forming material. The combination was fired at a temperature of 1200° C. As illustrated, the performance of sample S3 shows an improvement, over the Standard Alumina 1 and 2 samples, and a comparable performance to that of the Standard Alumina 3 sample.

Likewise, sample S4 shows an improvement in grinding performance over all samples of standard alumina. Sample S4 is a bonded abrasive including abrasive grains having an alumina core and a silica shell layer overlying the alumina core. The abrasive particles were made by combining alpha alumina particulate with 1.0 wt % silica (based on the total solids content) as a shell-forming material. The particles were fired at a temperature of 1200° C. As with the previous samples incorporating the core-shell structure, an improvement in grinding performance over each of the Standard Alumina samples.

Referring to sample S5, this sample used the same type of alumina grains as the Standard Alumina 3 sample within a bonded abrasive, however, the abrasive grains included a silica shell layer overlying the alumina core. Particularly, the abrasive particles of sample S5 were formed by combining alpha alumina particulate and 1.0 wt % silica (based on the total solids content) as a shell-forming material. The combination was fired at a temperature of 1200° C. As illustrated, sample S5 shows improved grinding performance over the Standard Alumina 3 sample. Sample S5 also demonstrates improved grinding performance over the Standard Alumina 1 and 2 samples.

Accordingly, sample S6 also utilizes the same type of alumina grains as the Standard Alumina 3 sample, but the abrasive grains utilize a silica shell layer overlying the alumina core. Particularly, the abrasive particles were formed by combining alpha alumina particulate with 0.5 wt % silica (based on the total solids content) and firing the combination at a temperature of 1200° C. Again, sample S6 shows improved grinding performance over the standard bonded abrasive sample, Standard Alumina 3. Sample S6 also shows improved grinding performance over the Standard Alumina 1 and 2 samples. While these samples illustrate the improved grinding performance of abrasive particles provided in embodiments herein, particularly the improved grinding performance of abrasive particles utilizing silica shell layer, abrasive particles utilizing a similar shell layer and comprising zirconia have demonstrated the same improved grinding performance.

According to embodiments herein, fixed abrasive articles are provided which have improved properties, such as enhanced grinding performance, compatibility with matrix materials and fillers, and extended lifetime. While the Inventors acknowledge the existence of certain abrasive particles having surface-modified structures, such as disclosed in U.S. Pat. No. 6,258,141 and U.S. Pat. No. 5,131,923, the presently disclosed abrasive articles are superior. With respect to U.S. Pat. No. 6,258,141, while the reference discloses the use of a coating formed from a salt-based precursor, the disclosed coating provides protection for alumina grains during the formation of the bonded abrasive article, preferably when the bond material is a low temperature vitreous material. Moreover, while U.S. Pat. No. 6,258,141 generally states that the alumina abrasive particles can be coated with a ceramic oxide, the reference goes on to state that a "ceramic oxide" is understood to refer to a metal oxide stable at temperatures over 1500° C., primarily magnesium oxide, titanium dioxide, cobalt oxide, nickel oxide, and chromium oxide. Additionally, these ceramic oxide coatings are not robust, as they are at most 1 wt % of the total weight of the particle, and typically much less. The ceramic oxide coatings disclosed in U.S. Pat. No. 6,258,141 are not intended to be robust coatings, rather they are thin coatings of material, often reacting with the alumina particles to create an aluminate compound, to reduce the surface area of the abrasive particles, thereby reducing the regions for carbon residue to settle, which during grinding can lead to discoloration of the workpiece.

With respect to U.S. Pat. No. 5,131,923, the reference discloses mixing a silicon containing material with alumina abrasive particles to create alumina particles having silica-enriched surfaces. However, the silica-enriched surfaces are not coherent coatings of silica, as they are simply formed by mixing the abrasive particles with a silicon containing compound, which in turn forms a film of amorphous silica on the surface of abrasive particles. The silica-enriched surfaces of the abrasive particles are untreated before forming the final product (i.e., a vitreous bonded abrasive) and thus amorphous and fragile, being susceptible to wear by attrition, especially during mixing of the components, and thus breaks down prior to forming the final bonded abrasive product. Accordingly, due to the combination of a weak, amorphous coating and handling of the particles prior to forming the final abrasive article, it is understood that the coatings are not conformal and do not substantially encapsulate the particles in the final formed abrasive product. Moreover, the formation of the amorphous silica-enriched surfaces functions only to aid in the bonding of the abrasive particles within a silica containing matrix material. Accordingly, such particles are limited in their use, particularly to vitreous bonded abrasives having a high content of silica.

Notably, the fixed abrasive articles of the present embodiments make use of fixed abrasives having a combination of features including for example, submicron grain size, composition, and an engineered core-shell structure. Notably, the combination of such elements provide an engineered structure designed to provide both resistance to particular chemicals present in grinding processes as well as a substantial coating designed to mitigate the effects of shelling, i.e. a sacrificial layer particularly designed to prevent fracturing of the alpha alumina grain. Additionally, embodiments herein provide methods of forming a robust polycrystalline shell overlying a core, which in combination with other features, provides improved grinding performance, mechanical stability, and chemical resistance. Accordingly, in the particular context of grinding and polishing, use of fixed abrasive devices incorporating particular abrasive grains provided herein, in combination with particular matrix materials and accompanying filler materials, enable fixed abrasive devices having improved mechanical stability, chemical stability, and grinding performance.

While the invention has been illustrated and described in the context of specific embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A fixed abrasive article comprising:
a matrix material; and
abrasive particles embedded in the matrix material, the abrasive particles having a core-shell structure that includes a polycrystalline alpha alumina core and a fired shell layer having a porosity of not greater than about 10 vol % overlying the polycrystalline alpha alumina core and comprising a polycrystalline material selected from the group consisting of silicon oxide and zirconium oxide, the polycrystalline alpha alumina core comprising grains having an average grain size of not greater than about 500 nm.

2. The fixed abrasive article of claim 1, wherein the fixed abrasive article is a coated abrasive.

3. The fixed abrasive article of claim 1, wherein the fired shell layer comprises a porosity of not greater than about 5 vol %.

4. The fixed abrasive article of claim 2, wherein the matrix material comprises a first adhesive layer overlying and in contact with a backing material.

5. The fixed abrasive article of claim 4, wherein the matrix material further comprises a second adhesive layer overlying the first adhesive layer.

6. The fixed abrasive article of claim 5, wherein the second adhesive layer further comprises a filler material comprising a halogen compound.

7. The fixed abrasive article of claim 1, wherein the fixed abrasive is a bonded abrasive.

8. The fixed abrasive article of claim 1, wherein the matrix material comprises a vitrified ceramic material.

9. The fixed abrasive article of claim 1, wherein the polycrystalline alpha alumina core has an average grain size of not greater than about 300 nm.

10. The fixed abrasive article of claim 1, wherein the shell layer substantially encapsulates the alpha alumina core.

11. The fixed abrasive article of claim 1, wherein the shell layer has an average thickness of not greater than about 10 microns.

12. The fixed abrasive article of claim 1, wherein the shell layer comprises not less than about 0.5 wt % of the entire weight of the particle.

13. The fixed abrasive article of claim 1, wherein the shell layer comprises zirconium oxide.

14. The fixed abrasive article of claim 13, wherein the zirconium oxide has a crystal structure selected from the group of structures including monoclinic, tetragonal, and cubic.

15. The fixed abrasive article of claim 1, wherein the shell layer comprises silicon oxide.

16. A method of forming a fixed abrasive comprising:
   combining alpha alumina particulate with a shell-forming material;
   firing the alpha alumina with the shell-forming material to form abrasive particles comprising a core-shell structure that includes a polycrystalline alpha alumina core and a fired shell layer having a porosity of not greater than about 10 vol % overlying the polycrystalline alpha alumina core and comprising a polycrystalline material selected from the group consisting of silicon oxide and zirconium oxide, the polycrystalline alpha alumina core comprising grains and having an average grain size of not greater than about 500 nm; and
   affixing the abrasive particles in a matrix material to form a fixed abrasive.

17. The method of claim 16, wherein the shell-forming material comprises a colloidal dispersion containing colloids suspended in a liquid medium.

18. The method of claim 17, wherein the colloids comprise a material selected from the group of materials consisting of zirconium oxide and silicon oxide.

19. The method of claim 16, wherein the alpha alumina is combined with the shell forming material in an amount of not less than about 80 wt % based upon a total solids content of alpha alumina and the shell-forming material.

20. The method of claim 16, wherein combining includes depositing the shell-forming material on the polycrystalline alpha alumina core.

21. The method of claim 20, wherein depositing the shell-forming layer is carried out by a vapor deposition process.

* * * * *